(12) United States Patent
Son et al.

(10) Patent No.: US 11,850,635 B2
(45) Date of Patent: Dec. 26, 2023

(54) APPARATUS FOR PROCESSING SUBSTRATE

(71) Applicant: SEMES Co., Ltd., Chungcheongnam-do (KR)

(72) Inventors: Dong Hee Son, Gyeonggi-do (KR); Ki Young Kwak, Gyeonggi-do (KR)

(73) Assignee: Semes Co., Ltd., Chungcheongnam-do (KR)

(*) Notice: Subject to any disclaimer, the term of this patent is extended or adjusted under 35 U.S.C. 154(b) by 214 days.

(21) Appl. No.: 17/402,882

(22) Filed: Aug. 16, 2021

(65) Prior Publication Data
US 2022/0126330 A1    Apr. 28, 2022

(30) Foreign Application Priority Data

Oct. 22, 2020 (KR) .................. 10-2020-0137239

(51) Int. Cl.
*B08B 3/08* (2006.01)
*B08B 3/04* (2006.01)

(52) U.S. Cl.
CPC .............. *B08B 3/041* (2013.01); *B08B 3/08* (2013.01)

(58) Field of Classification Search
None
See application file for complete search history.

(56) References Cited

U.S. PATENT DOCUMENTS

| | | | |
|---|---|---|---|
| 7,479,190 B2 | 1/2009 | Fukuda et al. | |
| 7,604,013 B2 | 10/2009 | Nakamura et al. | |
| 7,901,514 B2 | 3/2011 | Nakamura et al. | |
| 9,865,483 B2 | 1/2018 | Higashi et al. | |
| 10,720,320 B2 | 7/2020 | Emoto et al. | |
| 10,910,235 B2 | 2/2021 | Nakamura et al. | |
| 11,145,520 B2 | 10/2021 | Lee et al. | |

(Continued)

FOREIGN PATENT DOCUMENTS

| JP | 2692887 B2 | 12/1997 |
|---|---|---|
| JP | 2004200246 A | 7/2004 |

(Continued)

OTHER PUBLICATIONS

Taiwan Office Action for Taiwan Application No. 110125478, dated Feb. 1, 2023, 3 pages.

(Continued)

*Primary Examiner* — Cristi J Tate-Sims
(74) *Attorney, Agent, or Firm* — RatnerPrestia (57) ABSTRACT

A substrate processing apparatus includes a support unit; a first nozzle for discharging a first rinse solution to a first area of the substrate; and a second nozzle for discharging a second rinse solution to a second area of the substrate, wherein the first nozzle discharges the first rinse solution to a first area during a first period so that the first area and the second area of the substrate are wetted by the first rinse solution, and some area of the substrate is not wetted by the first rinse solution, wherein the first nozzle discharges the first rinse solution to the first area and the second nozzle discharges the second rinse solution to the second area in a second period directly connected to the first period so that an entire upper surface of the substrate is wetted by the first rinse solution and the second rinse solution.

18 Claims, 10 Drawing Sheets

(56) References Cited

U.S. PATENT DOCUMENTS

| | | | |
|---|---|---|---|
| 2006/0048792 A1* | 3/2006 | Nakamura | B08B 3/02 134/2 |
| 2007/0199579 A1 | 8/2007 | Hayasaki et al. | |
| 2008/0251101 A1* | 10/2008 | Ohno | H01L 21/67051 134/4 |
| 2014/0261570 A1 | 9/2014 | Orii et al. | |
| 2015/0020852 A1 | 1/2015 | Kato et al. | |
| 2017/0345641 A1 | 11/2017 | Lee et al. | |
| 2018/0068877 A1 | 3/2018 | Ishibashi | |

FOREIGN PATENT DOCUMENTS

| | | |
|---|---|---|
| JP | 2006080315 A | 3/2006 |
| JP | 2006093409 A | 4/2006 |
| JP | 2007220956 A | 8/2007 |
| JP | 2014199917 A | 10/2014 |
| JP | 2015023048 A | 2/2015 |
| JP | 2017069346 A | 4/2017 |
| KR | 20100026388 A | 3/2010 |
| KR | 20160036488 A | 4/2016 |
| KR | 20170134098 A | 12/2017 |
| KR | 20180026337 A | 3/2018 |
| TW | 201843730 A | 12/2018 |
| TW | 201942950 A | 11/2019 |
| TW | 202020937 A | 6/2020 |

OTHER PUBLICATIONS

Japanese Notice of Reasons for Refusal for Japanese Application No. 2021-136013, dated Sep. 6, 2022, with translation, 6 pages.
Korean Written Decision on Registration for Korean Application No. 10-2020-0137239, dated Jul. 26, 2023 with translation, 4 pages.

* cited by examiner

APPARATUS FOR PROCESSING SUBSTRATE

CROSS REFERENCE TO RELATED APPLICATION

This application claims the benefit of Korean Patent Application No. 10-2020-0137239, filed on Oct. 22, 2020, in the Korean Intellectual Property Office, the disclosure of which is incorporated herein by reference in its entirety.

FIELD OF THE INVENTION

The present invention relates to a substrate processing apparatus.

DESCRIPTION OF THE RELATED ART

When manufacturing a semiconductor device or a display device, various processes such as photography, etching, ashing, ion implantation, and thin film deposition are performed. Various processing liquids are used in each process, and contaminants and particles may be generated during the process. In order to solve this problem, a cleaning process for cleaning contaminants and particles is performed before and after each process.

SUMMARY OF THE INVENTION

During the cleaning process, the rinse solution is discharged onto the substrate while rotating the substrate. In an area far from the center of the substrate (e.g., an edge area), the rotation force is strong, and the thickness of the rinse solution may be reduced. Contaminants and particles are easily adsorbed on the surface of the area where the thickness of the rinse solution is reduced.

An aspect of the present invention is to provide a substrate processing apparatus capable of suppressing adsorption of particles to a surface of a substrate during a cleaning process.

The problems of the present invention are not limited to the problems mentioned above, and other problems not mentioned will be clearly understood by those skilled in the art from the following description.

One aspect of the substrate processing apparatus of the present invention for achieving the above object comprises a support unit that supports a substrate and is rotatable; a first nozzle for discharging a first rinse solution to a first area of the substrate; and a second nozzle for discharging a second rinse solution to a second area of the substrate different from the first area, wherein the first nozzle discharges the first rinse solution to a first area during a first period so that the first area and the second area of the substrate are wetted by the first rinse solution, and some area of the substrate is not wetted by the first rinse solution, wherein the first nozzle discharges the first rinse solution to the first area and the second nozzle discharges the second rinse solution to the second area in a second period directly connected to the first period so that an entire upper surface of the substrate is wetted by the first rinse solution and the second rinse solution.

Another aspect of the substrate processing apparatus of the present invention for achieving the above object comprises a support unit that supports a substrate and is rotatable; a first nozzle for discharging a first rinse solution to a central area of the substrate; and a second nozzle for discharging a second rinse solution to a middle area of the substrate, wherein, in an acceleration section, in which the substrate is rotated to a target speed after locating the substrate on the support unit, the first nozzle discharges a first rinse solution to a central area of the substrate so that a central area and a middle area of the substrate are wetted by the first rinse solution and an edge area of the substrate is not wetted by the first rinse solution, wherein, in a constant speed section directly connected to the acceleration section, the first nozzle discharges the first rinse solution to a central area of the substrate and the second nozzle discharges the second rinse solution to a middle area of the substrate.

Another aspect of the substrate processing apparatus of the present invention for achieving the above object comprises a support unit that supports a substrate and is rotatable; a first moving nozzle that waits in a first standby position, moves to a first supply position, and discharges a first chemical solution to the substrate; a second moving nozzle that waits in a second standby position, moves to a second supply position, and discharges a second chemical solution to the substrate; a first fixed nozzle for discharging a rinse solution to a first area of the substrate; and a second fixed nozzle for discharging a second rinse solution to an area of the substrate different from the first area, wherein the first fixed nozzle and the second fixed nozzle discharge a rinse solution to the substrate in a manner that the first fixed nozzle starts discharging a rinse solution first and the second fixed nozzle starts discharging a rinse solution with a time difference while the first moving nozzle returns to the first standby position after discharging the first chemical solution from the first supply position.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements or layers are referred to as "on" or "above" of other elements or other layers, it includes not only when directly above of the other elements or layers, but also other elements or layers intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

Figure 1:
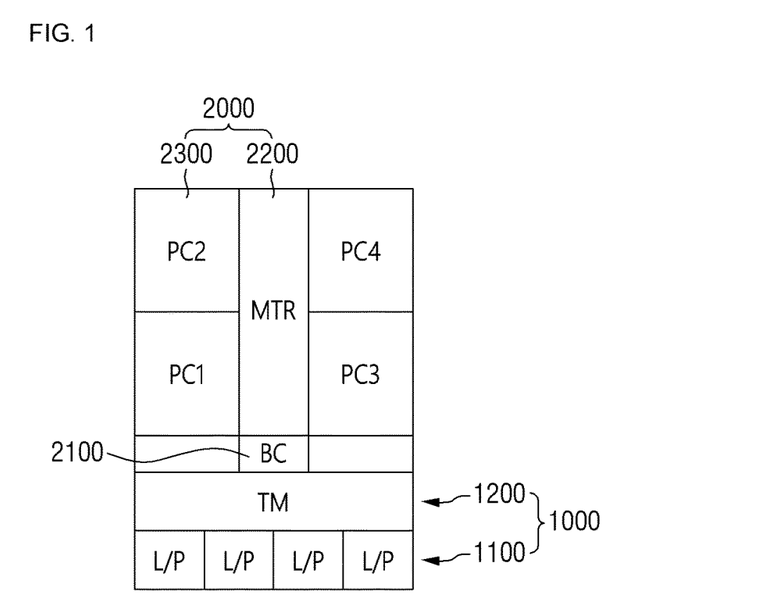
FIG. 1 is a plan view for describing a substrate processing apparatus according to some embodiments of the present invention.

FIG. 1 is a plan view for describing a substrate processing apparatus according to some embodiments of the present invention.

Referring to FIG. 1, a substrate processing apparatus according to some exemplary embodiments of the present invention includes an index module 1000 and a process module 2000.

The index module 1000 receives the substrate W from the outside, and transfers the substrate W to the process module 2000. The index module 1000 may be an equipment front end module (EFEM), and includes a load port 1100 and a transport frame 1200.

A container C, in which the substrate W is accommodated, is placed in the load port 1100. As the container (C), a front opening unified pod (FOUP) may be used. The container C may be brought into the load port 1100 from the outside by an overhead transfer (OHT) or may be carried out from the load port 1100 to the outside.

The transport frame 1200 transfers the substrate W between the container C placed on the load port 1100 and the process module 2000. The transport frame 1200 may include an index robot that moves on an index rail.

The process module 2000 includes a buffer chamber 2100, a transport chamber 2200, and a plurality of process chambers 2300.

The buffer chamber 2100 provides a space, in which the substrate W transported between the index module 1000 and the process module 2000 temporarily stays. A plurality of buffer slots may be located in the buffer chamber 2100. For example, the index robot of the transport frame 1200 may take out the substrate W from the container C and place it in the buffer slot.

The transport robot of the transport chamber 2200 may take out the substrate W placed in the buffer slot and transport it to a preset process chamber (e.g., PC1) among the plurality of process chambers 2300. In addition, the transport robot of the transport chamber 2200 may transport from one process chamber (e.g., PC1) to another process chamber (e.g., PC2) among the plurality of process chambers 2300.

The plurality of process chambers 2300 may be arranged in a line, stacked vertically, or a combination thereof. As illustrated, some process chambers PC1 and PC2 and some other process chambers PC3 and PC4 may be arranged on both sides of the transport chamber 2200. The arrangement of the plurality of process chambers 2300 is not limited to the above-described example, and may be changed in consideration of a footprint or process efficiency of a substrate processing apparatus.

Figure 2:
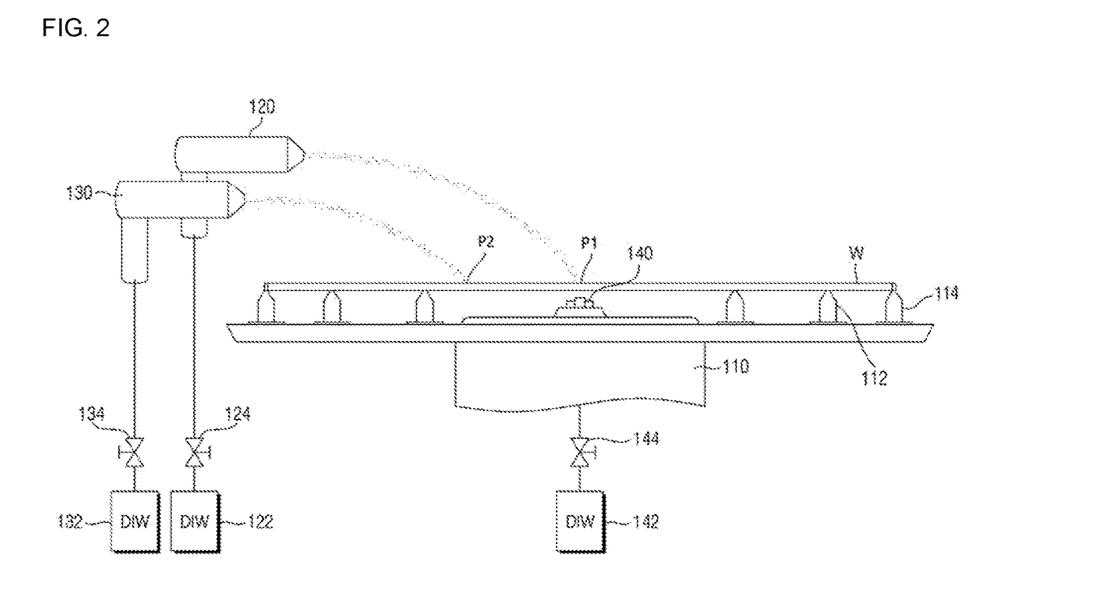
FIG. 2 is a conceptual diagram for describing an example of the process chamber of FIG. 1.

FIG. 2 is a conceptual diagram for describing an example of the process chamber of FIG. 1.

Referring to FIG. 2, a support unit 110 supporting a substrate W is arranged in a process chamber (e.g., PC1). The support unit 110 may rotate the substrate W at a preset speed (i.e., preset rotation speed). The support unit 110 is provided with a support pin 112 protruding from the upper surface to support the substrate W, and the like. In addition, the chuck pin 114 is installed at the edge of the upper surface of the support unit 110. The chuck pin 114 supports the edge of the substrate W so that the substrate W is not laterally separated when the support unit 110 rotates.

A periphery of the support unit 110 includes a first nozzle 120 and a second nozzle 130.

The first nozzle 120 discharges the first rinse solution to the first area P1 of the substrate W. The second nozzle 130 discharges the second rinse solution to the second area P2 of the substrate W different from the first area P1. As illustrated, the first area P1 may include the center of the substrate W. Alternatively, the first area P1 may be located closer to the center of the substrate W than the second area P2. That is, the second area P2 may be located closer to the edge area of the substrate W than the first area P1.

The first rinse solution and the second rinse solution may be pure water (DIW), but is not limited thereto.

The first nozzle 120 is fluidly connected to the first storage unit 122. The first valve 124 is arranged between the first nozzle 120 and the first storage unit 122, and may be controlled on/off by a control unit (not shown). The second nozzle 130 is fluidly connected to the second storage unit 132. The second valve 134 is arranged between the second nozzle 130 and the second storage unit 132 and may be controlled on/off by a control unit (not shown).

The first nozzle 120 and the second nozzle 130 may be fixedly installed.

In particular, the first nozzle 120 and the second nozzle 130 may be arranged to be biased laterally in the central area of the support unit 110. In other words, it is installed so as not to overlap the central area (e.g., see P1) of the substrate W seated on the support unit 110 in the horizontal and vertical directions.

In addition, when the rinse solution is discharged onto the substrate W while rotating the substrate W during the cleaning process, the thickness of the rinse solution may be reduced in an area far from the center of the substrate W due to strong rotation force. Therefore, in the substrate processing apparatus according to some embodiments of the present invention, the first nozzle 120 discharges the first rinse solution to the first area P1 (i.e., the central area) of the substrate W, and the second nozzle 130 discharges the second rinse solution to the second area P2 (i.e., the middle area) of the substrate W, thereby preventing the rinse solution from being thin in the area far from the center of the substrate W. A specific method of discharging the first rinse solution and the second rinse solution will be described later with reference to FIGS. 3 to 9.

A back nozzle 140 is installed in the support unit 110 to inject a fluid such as pure water and/or nitrogen gas to the rear surface of the substrate W. The back nozzle 140 may be arranged in a central area (e.g., a position corresponding to the P1 area) of the support unit 110. The back nozzle 140 is fluidly connected to, for example, a third storage unit 142 that stores pure water. The third valve 144 is arranged between the third nozzle 140 and the third storage unit 142, and may be controlled on/off by a control unit (not shown).

Figure 3:
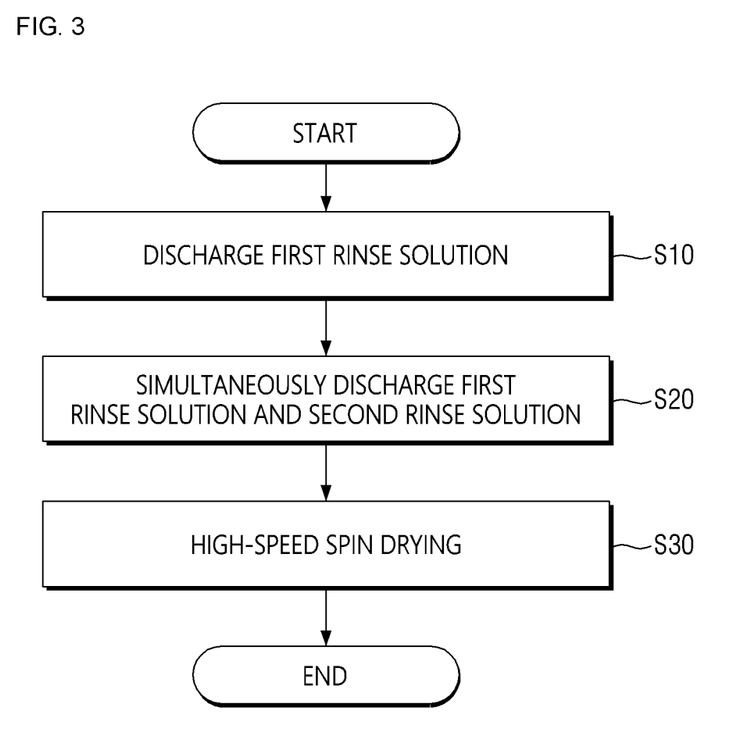
FIG. 3 is a flowchart for describing a substrate processing method according to the first embodiment of the present invention.

Hereinafter, a substrate processing method according to a first embodiment of the present invention will be described with reference to FIGS. 3 to 7. FIG. 3 is a flowchart illustrating a substrate processing method according to the first embodiment of the present invention. FIGS. 4 to 7 are intermediate step diagrams for describing the substrate processing method of FIG. 3.

Figure 4:
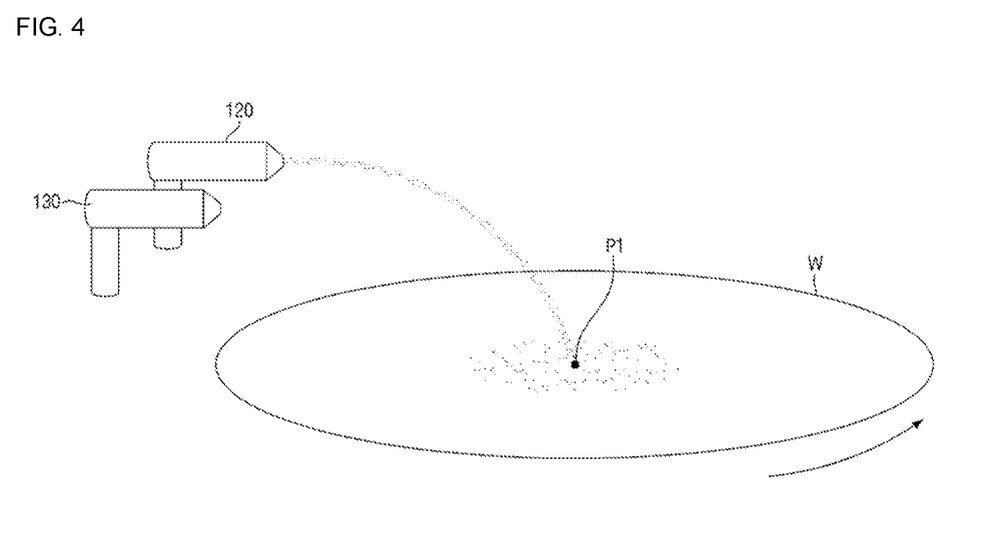
FIGS. 4 to 7 are intermediate step diagrams for describing the substrate processing method of FIG. 3.

Referring to FIGS. 3 and 4, while the substrate W is rotated, the first rinse solution is discharged during the first period (S10).

Specifically, the first nozzle 120 discharges the first rinse solution to the first area P1 of the substrate W. The first area P1 may include the central area of the substrate W or may be closer to the central area of the substrate W than the second area P2 to be described later. Since the substrate W is rotating, the first rinse solution discharged to the first area P1 gradually spreads in the edge direction of the substrate W. The first rinse solution spreads not only to the central area of the substrate W, but also to the middle area. In particular, during the first period, it does not spread to some area of the substrate W (e.g., an edge area of the substrate W).

During the first period, the second nozzle 130 does not discharge the second rinse solution to the substrate W.

The injection amount of the first nozzle 120 during the first period may be, for example, 1.2 l/min, but is not limited thereto.

Figure 5:
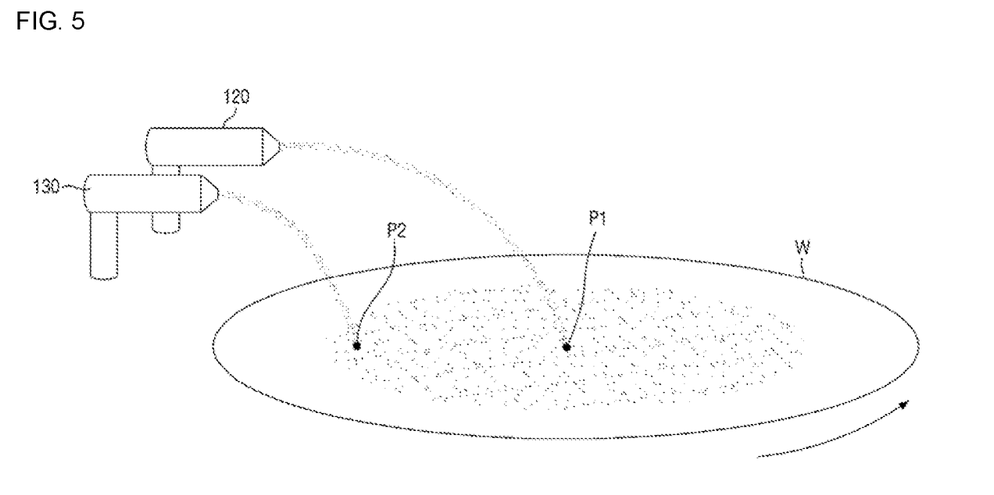
Figure 6:
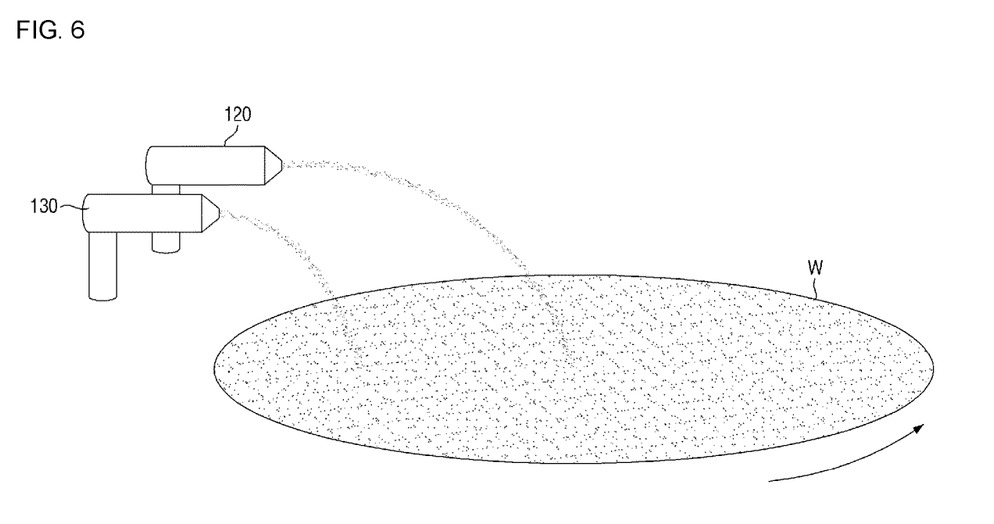

Next, referring to FIGS. 3, 5 and 6, while rotating the substrate W, the first nozzle 120 discharges the first rinse solution to the first area P1, and the second nozzle 130 discharges the second rinse solution to the second area P2 during a second period.

Specifically, the first nozzle 120 continuously discharges the first rinse solution during the first period and the second period. On the other hand, the second nozzle 130 starts discharging the second rinse solution with a time difference (i.e., does not discharge the second rinse solution in the first period), and discharges the second rinse solution during the second period.

FIG. 5 shows a state at the start point of the second period (that is, the time point, at which the second nozzle 130 starts discharging the second rinse solution), and FIG. 6 shows the state at the end point of the second period.

In particular, as shown in FIG. 5, a time point, at which the second nozzle 130 starts discharging the second rinse solution (i.e., a start point of the second period), is that the first rinse solution is spread up to a position, at which the second rinse solution is discharged (i.e., P2), and the first rinse solution is not spread over the entire substrate W. That is, it is a time point before the liquid film by the first rinse solution is formed on the entire substrate W. Alternatively, it is a time point when a liquid film by the first rinse solution is formed up to the central area and the middle area of the substrate W, but is not formed in the edge area.

Unlike some embodiments of the present invention, when the first nozzle 120 and the second nozzle 130 simultaneously discharge the first rinse solution and the second rinse solution in a state where a liquid film by the first rinse solution is not formed, an abnormal flow may occur in an area where the first rinse solution and the second rinse solution mix with each other, and accordingly, a special map is generated.

Alternatively, when the first nozzle 120 and the second nozzle 130 simultaneously discharge the first rinse solution and the second rinse solution in a state where the liquid film by the first rinse solution is not formed, defects may occur in and around the area where the second rinse solution comes into contact. This is because the first rinse solution is discharged to the central area of the substrate W, but the second rinse solution is discharged to the middle area of the substrate W, and thus, particles may be generated in and around the area where the second rinse solution comes into contact since the rotation force is strong in the area spaced apart from the center of the substrate W (i.e., the middle area).

Therefore, according to the substrate processing method according to some embodiments of the present invention, as shown in FIG. 5, when the second nozzle 130 starts discharging the second rinse solution, a liquid film by the first rinse solution is formed in the area where the second rinse solution comes into contact (i.e., see P2). If the liquid film is formed by the first rinse solution, the above-described problem may be prevented even if the second rinse solution is discharged to the second area P2.

Meanwhile, the cleaning process time can be shortened by discharging the second rinse solution before the liquid film by the first rinse solution is formed on the entire substrate W.

In addition, when the second rinse solution is discharged after the liquid film by the first rinse solution is formed on the entire substrate W, a water bomb by the second rinse solution may be generated.

Accordingly, according to the substrate processing method according to some embodiments of the present invention, the time point, at which the second nozzle 130 starts discharging the second rinse solution (i.e., the start point of the second period) is a time point when the first rinse solution is spread up to a position, at which the second rinse solution is discharged (i.e., P2), and the first rinse solution is not spread over the entire substrate W.

Meanwhile, during the second period, the injection amount of the first nozzle 120 may be greater than the injection amount of the second nozzle 130. For example, the injection amount of the first nozzle 120 may be 1.2 l/min, and the injection amount of the second nozzle 130 may be 1 l/min, but is not limited thereto.

Figure 7:
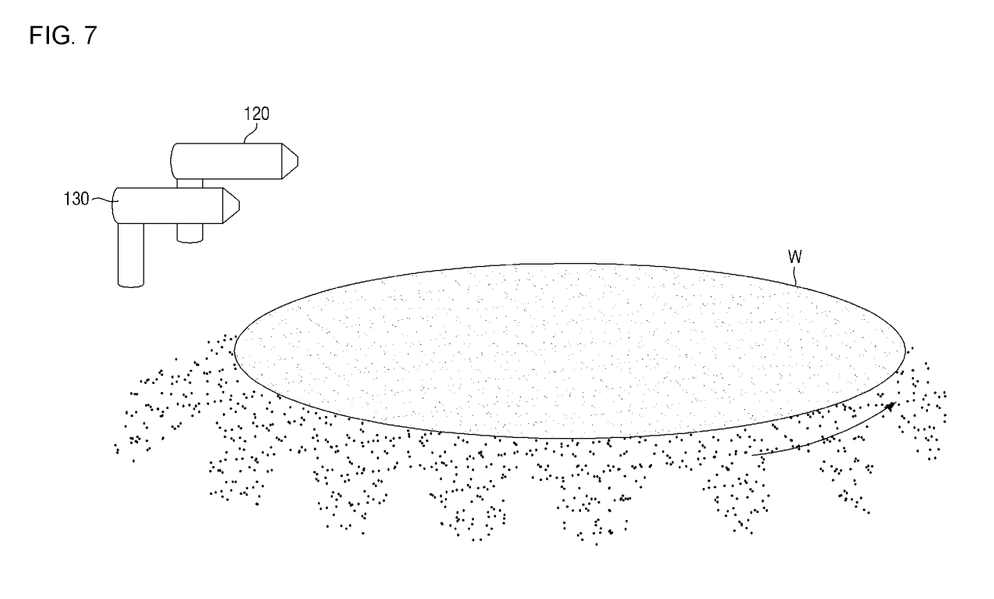

Referring to FIGS. 3 and 7, a drying operation is performed by stopping the discharge of the first rinse solution and the second rinse solution, and increasing the rotation speed of the substrate (i.e., high-speed spin drying) (S30).

In summary, by using the first nozzle 120 for discharging the first rinse solution to the central area P1 of the substrate and the second nozzle 130 for discharging the second rinse solution to the middle area P2 of the substrate, the liquid film thickness of the rinse solution can be made constant as a whole of the substrate W. In addition, by discharging the first rinse solution and the second rinse solution with a time difference, problems that may be caused by discharging the second rinse solution to an area far from the center of the substrate (i.e., see P2) may be solved. In addition, by discharging the second rinse solution before the liquid film by the first rinse solution is formed on the entire substrate W, the cleaning process time may be reduced.

Figure 8:
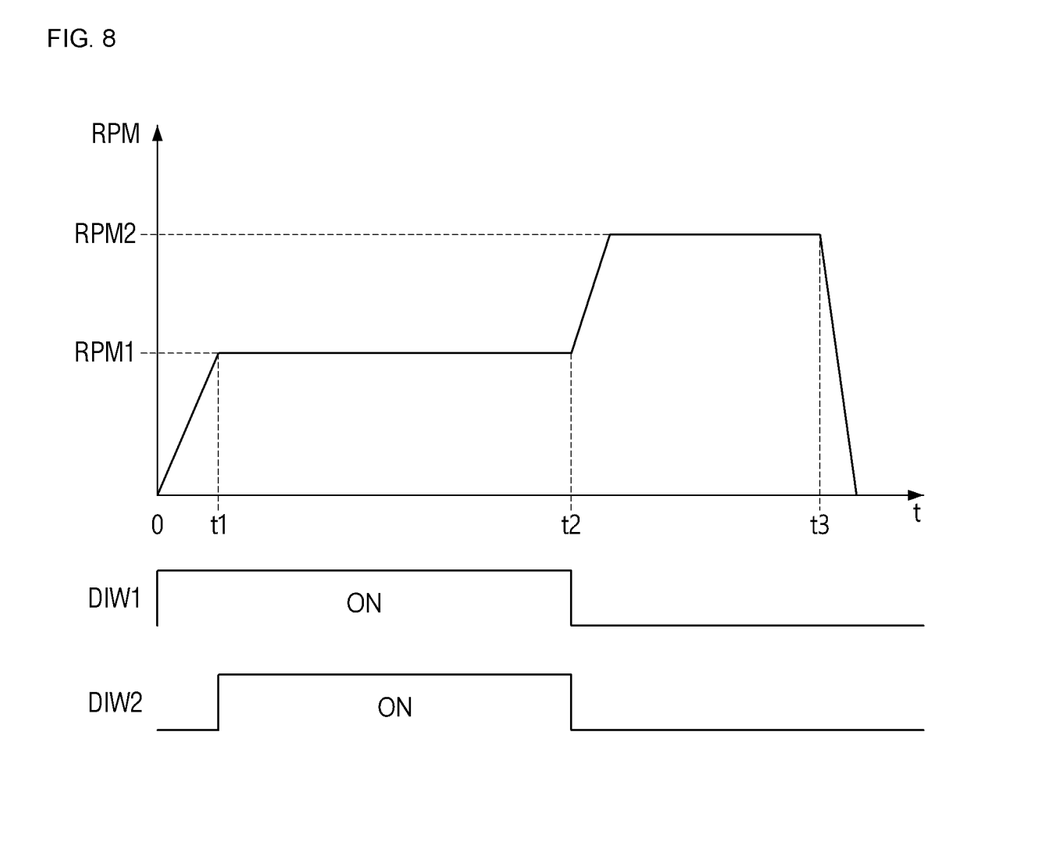
FIG. 8 is a view for describing a substrate processing method according to a second embodiment of the present invention.

FIG. 8 is a view for describing a substrate processing method according to a second embodiment of the present invention.

Referring to FIG. 8, first, a substrate W is located on a support unit (see 110 of FIG. 2).

The period 0 to t1 is an acceleration section, in which the support unit 110 starts to rotate to the target speed RPM1. The target speed RPM1 may be, for example, about 500 rpm.

In the acceleration section, the first nozzle (see 120 of FIG. 2) discharges the first rinse solution DIW1 to the first area (i.e., the central area), and starts to form a liquid film by the first rinse solution DIW1. In the acceleration section, the liquid film is not formed up to some area (i.e., an edge area) of the substrate W.

On the other hand, the rotation speed in the acceleration section is a speed lower than the target speed RPM1. Since the first rinse solution DIW1 is discharged onto the substrate W rotating at a relatively low rotation speed, problems that may occur while discharging the first rinse solution DIW1 (e.g., particle formation, etc.) can be minimized.

The period t1 to t2 is a constant speed section, in which the support unit 110 is rotated at a constant speed.

In the constant speed section, the first nozzle 120 discharges the first rinse solution DIW1, and the second nozzle (see 130 of FIG. 2) discharges the second rinse solution DIW2. The first nozzle 120 discharges the first rinse solution DIW1 to the first area (i.e., the central area), and the second nozzle 130 discharges the second rinse solution DIW2 to the second area (i.e., the middle area). As described above, at the time point when the second nozzle 130 discharges the second rinse solution DIW2, a liquid film by the first rinse solution DIW1 is not formed in the edge area of the substrate W.

The period t2 to t3 is a section for high-speed spin drying. Before entering the high-speed spin drying, the discharge of the first rinse solution and the second rinse solution is stopped. By increasing the rotation speed of the support unit 110, the support unit 110 is rotated to the drying speed RPM2. The drying speed RPM2 may be, for example, about 1500 rpm.

After the period t2 to t3, the cleaning operation is finished.

Meanwhile, although not shown separately, when the acceleration is rapidly performed in the period 0 to t1, the first rinse solution DIW1 may rapidly spread in the edge direction of the substrate W. In this case, the second rinse solution DIW2 may start to be discharged before time t1.

That is, the acceleration section (0 to t1) includes a front section and a back section. In the front section of the acceleration section (0 to t1), the first nozzle 120 discharges the first rinse solution to the central area of the substrate W and the second nozzle 130 does not discharge the second rinse solution. In the back section of the acceleration section (0 to t1), the first nozzle 120 may discharge the first rinse solution to the central area of the substrate W, and the second nozzle 130 may discharge the second rinse solution to the middle area of the substrate W.

Figure 9:
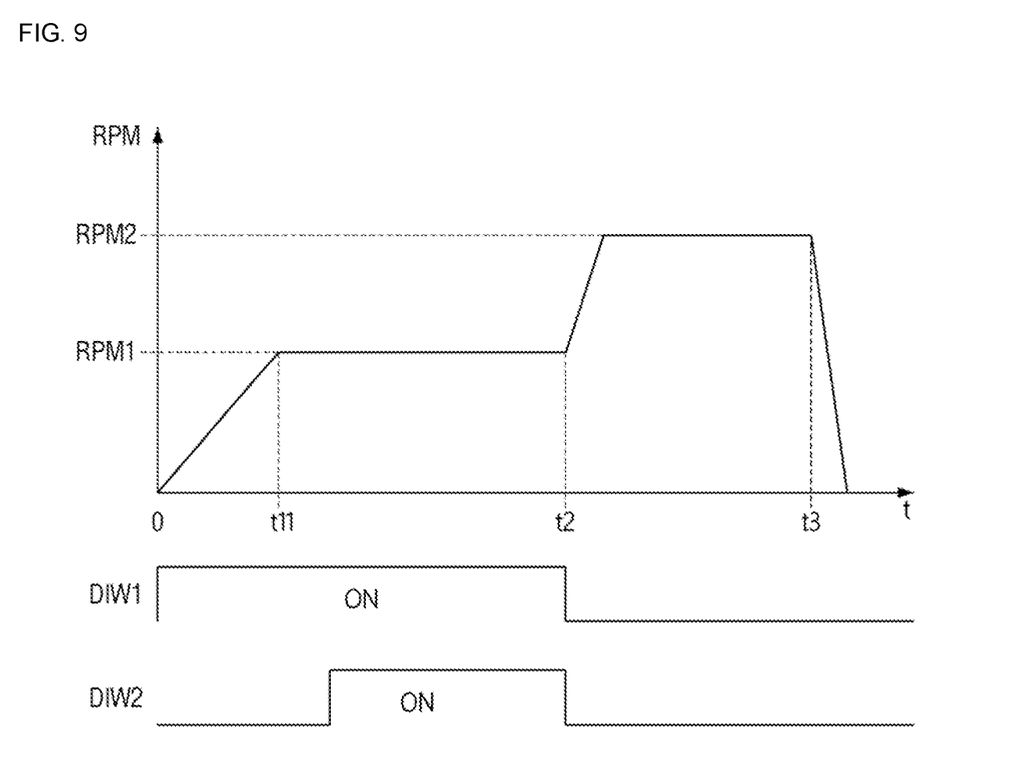
FIG. 9 is a view for describing a substrate processing method according to a third embodiment of the present invention.

FIG. 9 is a view for describing a substrate processing method according to a third embodiment of the present invention. For convenience of description, the points different from those described with reference to FIG. 8 will be mainly described.

Referring to FIG. 9, first, a substrate W is located on the support unit 110.

During the period 0 to t11, the rotation speed of the support unit 110 is increased to rotate to the target speed RPM1. In the period 0 to t11, the first rinse solution DIW1 is discharged onto the substrate W.

During the period t11 to t2, the support unit 110 is rotated at the target speed RPM1.

Here, when the acceleration in the period 0 to t11 is made slowly, even if the rotation speed of the support unit 110 reaches the target speed RPM1, the liquid film by the first rinse solution DIW1 may not be formed in the second area (that is, middle area).

In this case, after waiting until a liquid film by the first rinse solution DIW1 is formed up to the second area (i.e., the middle area), the second rinse solution DIW2 is started to be discharged. As illustrated in FIG. 9, the second rinse solution DIW2 does not start to be discharged at time t11, but the second rinse solution DIW2 may start to be discharged at a later timing.

During the period t2 to t3, the support unit 110 is rotated at the drying speed RPM1 to dry the substrate W.

Figure 10:
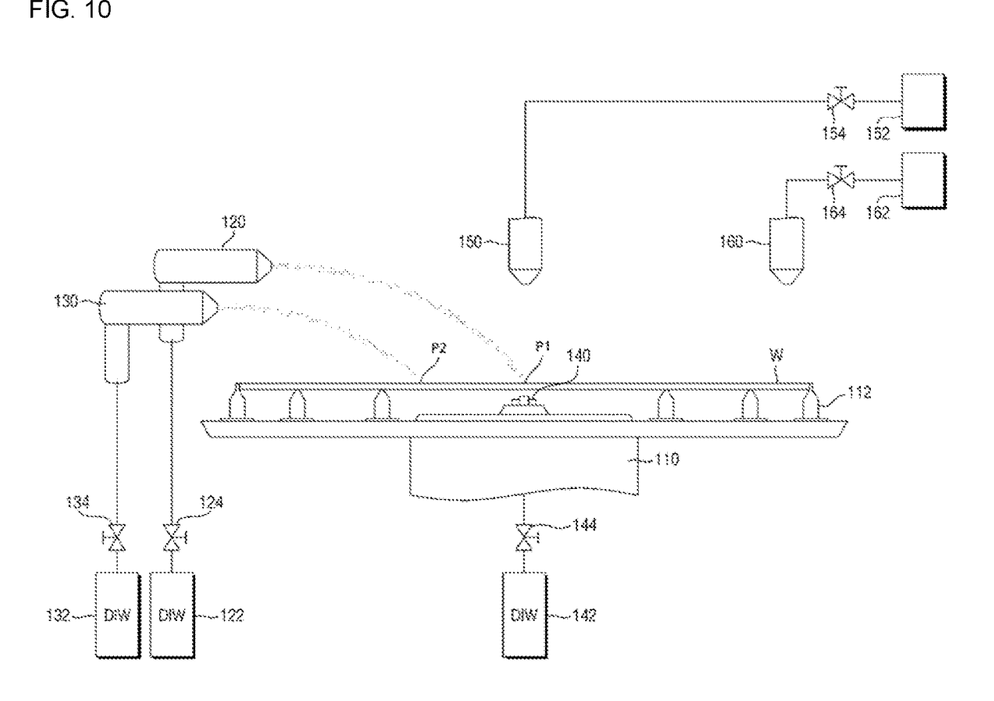
FIG. 10 is a conceptual diagram for describing another example of the process chamber of FIG. 1.

FIG. 10 is a conceptual diagram for describing another example of the process chamber of FIG. 1. For convenience of description, the points different from those described with reference to FIG. 2 will be mainly described.

Referring to FIG. 10, a support unit 110 supporting a substrate W is arranged in a process chamber (e.g., PC1). The support unit 110 may rotate the substrate W at a preset speed (i.e., a preset rotation speed).

A periphery of the support unit 110 includes a first nozzle 120 and a second nozzle 130. The first nozzle 120 and the second nozzle 130 may be fixedly installed. The first nozzle 120 and the second nozzle 130 may be arranged to be biased laterally in the central area (see P1) of the support unit 110. In other words, it is installed so as not to overlap the central area P1 of the substrate W seated on the support unit 110 in the horizontal and vertical directions.

In addition, the first moving nozzle 150 and the second moving nozzle 160 may be located above the support unit 110.

The first moving nozzle 150 waits at the first standby position, moves to the first supply position, and discharges the first chemical solution onto the upper surface of the substrate W. The first moving nozzle 150 is fluidly connected to the storage unit 152 for storing the first chemical solution (e.g., HF). The valve 154 is arranged between the first moving nozzle 150 and the storage unit 152, and may be controlled on/off by a control unit (not shown).

The second moving nozzle 160 waits at the second standby position, moves to the second supply position, and discharges a second chemical solution different from the first chemical solution onto the upper surface of the substrate W. The second moving nozzle 160 is fluidly connected to the storage unit 162 for storing the second chemical solution (e.g., SC1). The valve 164 is arranged between the second moving nozzle 160 and the storage unit 162, and may be controlled on/off by a control unit (not shown).

The first rinse solution and the second rinse solution may be discharged onto the substrate W before the first chemical solution and the second chemical solution are discharged to the substrate W (i.e., pre-wetting). Also, the first rinse solution and the second rinse solution may be discharged onto the substrate W after the first chemical solution is discharged and before the second chemical solution is discharged. A specific cleaning method will be described later with reference to FIGS. 11 to 14.

Figure 11:
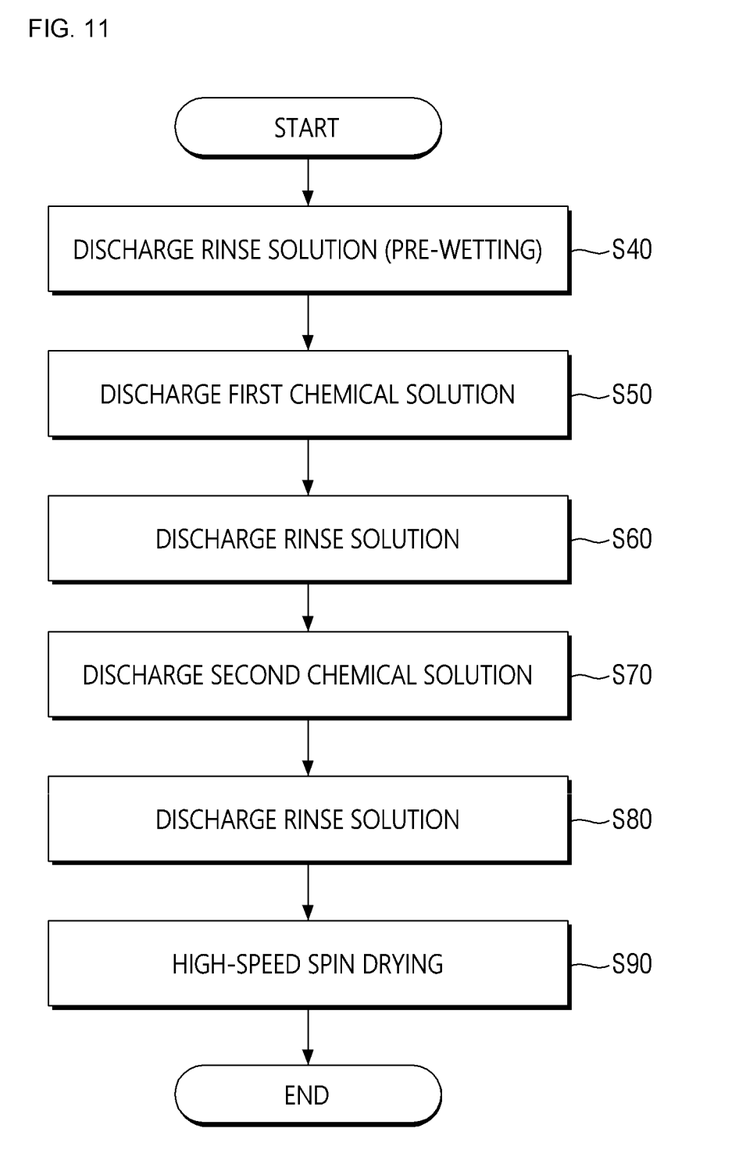
FIG. 11 is a flowchart for describing a substrate processing method according to a fourth embodiment of the present invention.
Figure 12:
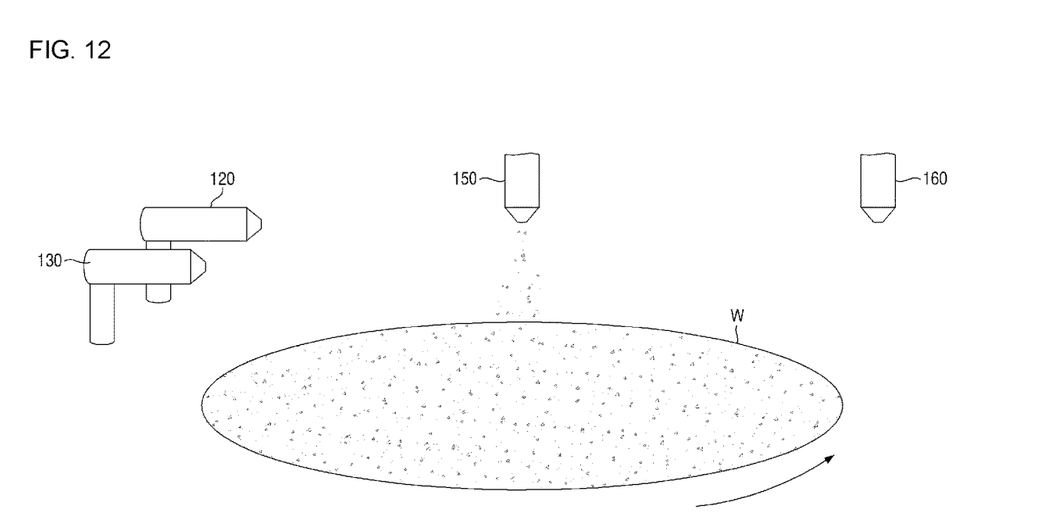
FIGS. 12 to 14 are intermediate step diagrams for describing the substrate processing method of FIG. 11.
Figure 13:
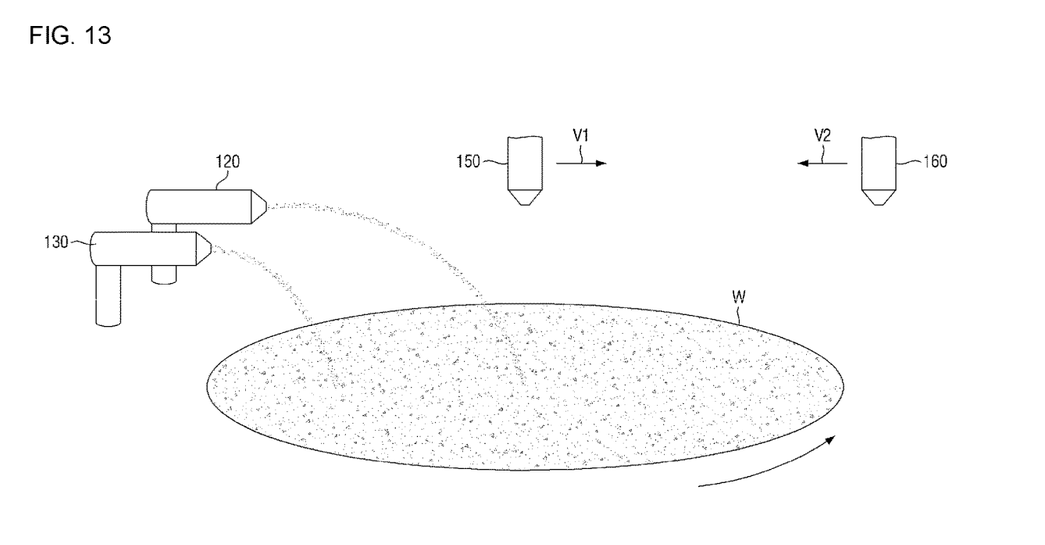
Figure 14:
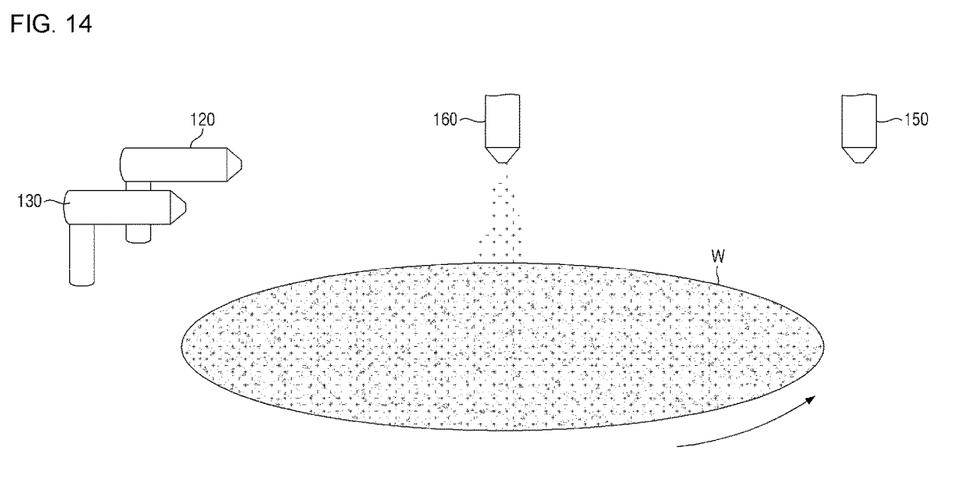

FIG. 11 is a flowchart for describing a substrate processing method according to a fourth embodiment of the present invention. FIGS. 12 to 14 are intermediate step diagrams for describing the substrate processing method of FIG. 11.

First, referring to FIG. 11, the rinse solution is discharged (pre-wetting) (S40). The first nozzle 120 and the second nozzle 130 discharge the first rinse solution and the second rinse solution with a time difference.

Then, referring to FIGS. 11 and 12, the first moving nozzle 150 discharges the first chemical solution (e.g., HF) onto the substrate W (S50). The first moving nozzle 150 discharges the first chemical solution at the first supply position (e.g., above the central area of the substrate W).

Subsequently, referring to FIGS. 11 and 13, the rinse solution is discharged (S60).

Specifically, the first moving nozzle 150 moves from the first supply position to the first standby position (see reference numeral V1). At the same time, the second moving nozzle 160 moves from the second standby position to the second supply position (see reference numeral V2). The first supply position and the second supply position may be substantially the same position, but is not limited thereto.

During the moving time of the first moving nozzle 150 and the second moving nozzle 160, the substrate may dry. When the substrate dries, defects may easily occur due to particles or the like. Accordingly, during the moving time of the first moving nozzle 150 and the second moving nozzle 160, the first nozzle 120 and the second nozzle 130 discharge the first rinse solution and the second rinse solution with a time difference so that the substrate W is maintained in a wet state with the first rinse solution DIW1 and the second rinse solution DIW2.

As described above, the first nozzle 120 and the second nozzle 130 are biased in the lateral direction in the central area of the support unit 110 and are fixedly installed. This is because while the first moving nozzle 150 and/or the second moving nozzle 160 are moving, the first nozzle 120 and the second nozzle 130 discharge the first rinse solution DIW1 and the second rinsing solution DIW2, and thus the first nozzle 120 and the second nozzle 130 are located where they do not interfere with the movement paths of the first moving nozzle 150 and the second moving nozzle 160.

Then, referring to FIGS. 11 and 14, the second moving nozzle 160 discharges the second chemical solution (e.g., SC1) onto the substrate W (S70). The second moving nozzle 160 discharges the second chemical solution at the second supply position (e.g., above the central area of the substrate W).

Then, referring to FIG. 11, the rinse solution is discharged (S80). The first nozzle 120 and the second nozzle 130 discharge the first rinse solution DIW1 and the second rinse solution DIW2 with a time difference.

Next, referring to FIG. 12, a drying operation is performed by stopping the discharge of the first rinse solution DIW1 and the second rinse solution DIW2, and increasing the rotation speed of the substrate (i.e., high-speed spin drying) (S90).

Although embodiments of the present invention have been described with reference to the above and the accompanying drawings, those of ordinary skill in the art to which the present invention pertains can understand that the present invention can be practiced in other specific forms without changing its technical spirit or essential features. Therefore, it should be understood that the embodiments described above are illustrative in all respects and not limiting.

What is claimed is:

1. An apparatus for processing a substrate comprising:
   a support unit that supports a substrate and is rotatable;
   a first nozzle for discharging a first rinse solution to a first area of the substrate;
   a second nozzle for discharging a second rinse solution to a second area of the substrate different from the first area; and
   a control unit for controlling the first nozzle and the second nozzle,
   wherein the control unit controls the first nozzle to discharge the first rinse solution to a first area during a first period so that the first area and the second area of the substrate are wetted by the first rinse solution, and some area of the substrate is not wetted by the first rinse solution,
   wherein the control unit controls the first nozzle to discharge the first rinse solution to the first area and the second nozzle to discharge the second rinse solution to the second area in a second period directly connected to the first period so that an entire upper surface of the substrate is wetted by the first rinse solution and the second rinse solution, and
   wherein the second period includes a section, in which a rotation speed of the substrate is a constant speed.

2. The apparatus of claim 1, wherein the second area is located closer to an edge area of the substrate than the first area.

3. The apparatus of claim 2, wherein some area of the substrate that is not wetted by the first rinse solution includes an edge area of the substrate.

4. The apparatus of claim 1, wherein the first nozzle and the second nozzle are fixedly installed so as not to overlap a central area of the support unit in a horizontal direction and a vertical direction.

5. The apparatus of claim 1, wherein the first period includes a section, in which a rotation speed of the substrate increases.

6. The apparatus of claim 1, wherein an injection amount of the first nozzle is greater than an injection amount of the second nozzle during the second period.

7. An apparatus for processing a substrate comprising:
a support unit that supports a substrate and is rotatable;
a first nozzle for discharging a first rinse solution to a central area of the substrate;
a second nozzle for discharging a second rinse solution to a middle area of the substrate; and
a control unit for controlling the first nozzle and the second nozzle,
wherein, in an acceleration section, in which the substrate is rotated to a target speed after locating the substrate on the support unit, the control unit controls the first nozzle to discharge a first rinse solution to a central area of the substrate so that a central area and a middle area of the substrate are wetted by the first rinse solution and an edge area of the substrate is not wetted by the first rinse solution,
wherein, in a constant speed section directly connected to the acceleration section, the control unit controls the first nozzle to discharge the first rinse solution to a central area of the substrate and the second nozzle to discharge the second rinse solution to a middle area of the substrate.

8. The apparatus of claim 7, wherein the first nozzle discharges a first rinse solution to a central area of the substrate and the second nozzle does not discharge a second rinse solution in a front section of the acceleration section,
wherein the first nozzle discharges the first rinse solution to a central area of the substrate and the second nozzle discharges the second rinse solution to a middle area of the substrate in a back section of the acceleration section.

9. The apparatus of claim 7, wherein the first nozzle and the second nozzle are fixedly installed so as not to overlap a central area of the support unit in a horizontal direction and a vertical direction.

10. The apparatus of claim 7, wherein an injection amount of the first nozzle is greater than an injection amount of the second nozzle during the constant speed section.

11. An apparatus for processing a substrate comprising:
a support unit that supports a substrate and is rotatable;
a first moving nozzle that waits in a first standby position, moves to a first supply position, and discharges a first chemical solution to the substrate;
a second moving nozzle that waits in a second standby position, moves to a second supply position, and discharges a second chemical solution to the substrate;
a first fixed nozzle for discharging a rinse solution to a first area of the substrate;
a second fixed nozzle for discharging a second rinse solution to an area of the substrate different from the first area; and
a control unit for controlling the first moving nozzle, the second moving nozzle, the first fixed nozzle, and the second fixed nozzle,
wherein the control unit controls the first fixed nozzle and the second fixed nozzle to discharge a rinse solution to the substrate in such a manner that the first fixed nozzle starts discharging a rinse solution first and the second fixed nozzle starts discharging a rinse solution with a time difference while the control unit controls the first moving nozzle to return to the first standby position after discharging the first chemical solution from the first supply position.

12. The apparatus of claim 11, wherein the first fixed nozzle and the second fixed nozzle discharge a rinse solution to the substrate in a manner that the first fixed nozzle starts discharging a rinse solution first and the second fixed nozzle starts discharging a rinse solution with a time difference while the second moving nozzle moves from the second standby position to the second supply position.

13. The apparatus of claim 12, wherein the returning of the first moving nozzle to the first standby position and the moving of the second moving nozzle to the second supply position occur simultaneously.

14. The apparatus of claim 11, wherein the second area is located closer to an edge area of the substrate than the first area.

15. The apparatus of claim 11, wherein the first fixed nozzle and the second fixed nozzle are fixedly installed so as not to overlap a central area of the support unit in a horizontal direction and a vertical direction.

16. The apparatus of claim 11, wherein, in an acceleration section, in which the substrate is rotated to a target speed after locating the substrate on the support unit, the first fixed nozzle discharges a rinse solution to the substrate and the second fixed nozzle does not discharge a rinse solution.

17. The apparatus of claim 16, wherein the first fixed nozzle and the second fixed nozzle discharge a rinse solution in a constant speed section directly connected to the acceleration section.

18. The apparatus of claim 17, wherein an injection amount of the first fixed nozzle is greater than an injection amount of the second fixed nozzle during the constant speed section.

* * * * *